(12) United States Patent
Rome et al.

(10) Patent No.: US 6,970,003 B2
(45) Date of Patent: Nov. 29, 2005

(54) ELECTRONICS BOARD LIFE PREDICTION OF MICROPROCESSOR-BASED TRANSMITTERS

(75) Inventors: Gregory H. Rome, Fridley, MN (US); Evren Eryurek, Minneapolis, MN (US); Kadir Kavaklioglu, Edina, MN (US)

(73) Assignee: Rosemount Inc., Eden Prairie, MN (US)

( * ) Notice: Subject to any disclaimer, the term of this patent is extended or adjusted under 35 U.S.C. 154(b) by 480 days.

(21) Appl. No.: 09/799,824

(22) Filed: Mar. 5, 2001

(65) Prior Publication Data
US 2002/0121910 A1 Sep. 5, 2002

(51) Int. Cl.$^7$ .............................................. G01R 27/08
(52) U.S. Cl. ...................................... 324/718; 324/713
(58) Field of Search .................................. 324/718, 713

(56) References Cited

U.S. PATENT DOCUMENTS

| | | | |
|---|---|---|---|
| 3,096,434 A | 7/1963 | King ........................... | 235/151 |
| 3,404,264 A | 10/1968 | Kugler ......................... | 235/194 |
| 3,468,164 A | 9/1969 | Sutherland ................... | 73/343 |
| 3,590,370 A | 6/1971 | Fleischer ..................... | 324/51 |
| 3,688,190 A | 8/1972 | Blum ........................ | 324/61 R |
| 3,691,842 A | 9/1972 | Akeley ....................... | 73/398 C |
| 3,701,280 A | 10/1972 | Stroman ....................... | 73/194 |
| 3,855,858 A | 12/1974 | Cusing ..................... | 73/194 EM |
| 3,973,184 A | 8/1976 | Raber ........................... | 324/51 |
| RE29,383 E | 9/1977 | Gallatin et al. ................ | 137/14 |
| 4,058,975 A | 11/1977 | Gilbert et al. .............. | 60/39.28 |
| 4,099,413 A | 7/1978 | Ohte et al. ..................... | 73/359 |
| 4,102,199 A | 7/1978 | Tsipouras ..................... | 73/362 |
| 4,122,719 A | 10/1978 | Carlson et al. ................ | 73/342 |
| 4,249,164 A | 2/1981 | Tivy ........................ | 340/870.3 |
| 4,250,490 A | 2/1981 | Dahlke .................. | 340/870.37 |
| 4,337,516 A | 6/1982 | Murphy et al. ............. | 364/551 |
| 4,399,824 A | 8/1983 | Davidson ..................... | 128/736 |
| 4,517,468 A | 5/1985 | Kemper et al. ................ | 290/52 |
| 4,528,869 A | 7/1985 | Kubo et al. ..................... | 74/695 |
| 4,530,234 A | 7/1985 | Cullick et al. .................. | 73/53 |
| 4,571,689 A | 2/1986 | Hildebrand et al. ......... | 364/481 |
| 4,635,214 A | 1/1987 | Kasai et al. ................. | 364/551 |
| 4,642,782 A | 2/1987 | Kemper et al. ............. | 364/550 |
| 4,644,479 A | 2/1987 | Kemper et al. ............. | 364/550 |
| 4,649,515 A | 3/1987 | Thompson et al. ......... | 364/900 |
| 4,668,473 A | 5/1987 | Agarwal ....................... | 422/62 |

(Continued)

FOREIGN PATENT DOCUMENTS

| | | |
|---|---|---|
| DE | 32 13 866 A1 | 10/1983 |
| DE | 35 40 204 C1 | 9/1986 |
| DE | 40 08 560 A1 | 9/1990 |
| DE | 43 43 747 | 6/1994 |
| DE | 44 33 593 A1 | 6/1995 |

(Continued)

OTHER PUBLICATIONS

International Search Report from International Application No.: PCT/US2004/025291, filed Aug. 5, 20004.

"A TCP\IP Tutorial" by, Socolofsky et al., Spider Systems Limited, Jan. 1991 pp. 1–23.

(Continued)

*Primary Examiner*—Anjan Deb
*Assistant Examiner*—Timothy J. Dole
(74) *Attorney, Agent, or Firm*—Westman, Champlin & Kelly, P.A.

(57) ABSTRACT

A field device includes circuitry to successively measure a parameter related to current drawn by electronics of the field device. The measurements are provided to a prediction engine which calculates a diagnostic output based upon the plurality of current-related measurements. The diagnostic prediction provided by the prediction engine can provide an estimate of viable life remaining for the device electronics. The diagnostic feature provides on-line status of the overall status of the field transmitter.

13 Claims, 5 Drawing Sheets

U.S. PATENT DOCUMENTS

| | | | |
|---|---|---|---|
| 4,686,638 A | 8/1987 | Furuse | 364/558 |
| 4,707,796 A | 11/1987 | Calabro et al. | 364/552 |
| 4,720,806 A | 1/1988 | Schippers et al. | 364/551 |
| 4,736,367 A | 4/1988 | Wroblewski et al. | 370/85 |
| 4,777,585 A | 10/1988 | Kokawa et al. | 364/164 |
| 4,807,151 A | 2/1989 | Citron | 364/510 |
| 4,831,564 A | 5/1989 | Suga | 364/551.01 |
| 4,841,286 A | 6/1989 | Kummer | 340/653 |
| 4,873,655 A | 10/1989 | Kondraske | 364/553 |
| 4,907,167 A | 3/1990 | Skeirik | 364/500 |
| 4,924,418 A | 5/1990 | Backman et al. | 364/550 |
| 4,934,196 A | 6/1990 | Romano | 73/861.38 |
| 4,939,753 A | 7/1990 | Olson | 375/107 |
| 4,964,125 A | 10/1990 | Kim | 371/15.1 |
| 4,988,990 A | 1/1991 | Warrior | 340/25.5 |
| 4,992,965 A | 2/1991 | Holter et al. | 364/551.01 |
| 5,005,142 A | 4/1991 | Lipchak et al. | 364/550 |
| 5,019,760 A | 5/1991 | Chu et al. | 318/490 |
| 5,025,344 A | 6/1991 | Maly et al. | 361/88 |
| 5,043,862 A | 8/1991 | Takahashi et al. | 364/162 |
| 5,053,815 A | 10/1991 | Wendell | 355/208 |
| 5,057,774 A | 10/1991 | Verhelst et al. | 324/537 |
| 5,067,099 A | 11/1991 | McCown et al. | 364/550 |
| 5,081,598 A | 1/1992 | Bellows et al. | 364/550 |
| 5,089,979 A | 2/1992 | McEachern et al. | 364/571.04 |
| 5,089,984 A | 2/1992 | Struger et al. | 395/650 |
| 5,098,197 A | 3/1992 | Shepard et al. | 374/120 |
| 5,099,436 A | 3/1992 | McCown et al. | 364/550 |
| 5,103,409 A | 4/1992 | Shimizu et al. | 364/556 |
| 5,111,531 A | 5/1992 | Grayson et al. | 395/23 |
| 5,121,467 A | 6/1992 | Skeirik | 395/11 |
| 5,122,794 A | 6/1992 | Warrior | 340/825.2 |
| 5,122,976 A | 6/1992 | Bellows et al. | 364/550 |
| 5,130,936 A | 7/1992 | Sheppard et al. | 364/551.01 |
| 5,134,574 A | 7/1992 | Beaverstock et al. | 364/551.01 |
| 5,137,370 A | 8/1992 | McCullock et al. | 374/173 |
| 5,142,612 A | 8/1992 | Skeirik | 395/11 |
| 5,143,452 A | 9/1992 | Maxedon et al. | 374/170 |
| 5,148,378 A | 9/1992 | Shibayama et al. | 364/551.07 |
| 5,150,289 A | 9/1992 | Badavas | 364/154 |
| 5,167,009 A | 11/1992 | Skeirik | 395/27 |
| 5,175,678 A | 12/1992 | Frerichs et al. | 364/148 |
| 5,193,143 A | 3/1993 | Kaemmerer et al. | 395/51 |
| 5,197,114 A | 3/1993 | Skeirik | 395/22 |
| 5,197,328 A | 3/1993 | Fitzgerald | 73/168 |
| 5,212,765 A | 5/1993 | Skeirik | 395/11 |
| 5,214,582 A | 5/1993 | Gray | 364/424.03 |
| 5,216,226 A | 6/1993 | Miyoshi | 219/497 |
| 5,224,203 A | 6/1993 | Skeirik | 395/22 |
| 5,228,780 A | 7/1993 | Shepard et al. | 374/175 |
| 5,235,527 A | 8/1993 | Ogawa et al. | 364/571.05 |
| 5,265,031 A | 11/1993 | Malczewski | 364/497 |
| 5,265,222 A | 11/1993 | Nishiya et al. | 395/3 |
| 5,269,311 A | 12/1993 | Kirchner et al. | 128/672 |
| 5,274,572 A | 12/1993 | O'Neill et al. | 364/550 |
| 5,282,131 A | 1/1994 | Rudd et al. | 364/164 |
| 5,282,261 A | 1/1994 | Skeirik | 395/22 |
| 5,293,585 A | 3/1994 | Morita | 395/52 |
| 5,303,181 A | 4/1994 | Stockton | 365/96 |
| 5,305,230 A | 4/1994 | Matsumoto et al. | 364/495 |
| 5,311,421 A | 5/1994 | Nomura et al. | 364/157 |
| 5,317,520 A | 5/1994 | Castle | 364/482 |
| 5,327,357 A | 7/1994 | Feinstein et al. | 364/502 |
| 5,333,240 A * | 7/1994 | Matsumoto et al. | 706/20 |
| 5,347,843 A | 9/1994 | Orr et al. | 73/3 |
| 5,349,541 A | 9/1994 | Alexandro, Jr. et al. | 364/578 |
| 5,357,449 A | 10/1994 | Oh | 364/551.01 |
| 5,361,628 A | 11/1994 | Marko et al. | 73/116 |
| 5,365,423 A | 11/1994 | Chand | 364/140 |
| 5,367,612 A | 11/1994 | Bozich et al. | 395/22 |
| 5,384,699 A | 1/1995 | Levy et al. | 364/413.13 |
| 5,386,373 A | 1/1995 | Keeler et al. | 364/577 |
| 5,388,465 A | 2/1995 | Okaniwa et al. | 73/861.17 |
| 5,392,293 A | 2/1995 | Hsue | 324/765 |
| 5,394,341 A | 2/1995 | Kepner | 364/551.01 |
| 5,394,543 A | 2/1995 | Hill et al. | 395/575 |
| 5,404,064 A | 4/1995 | Mermelstein et al. | 310/319 |
| 5,408,406 A | 4/1995 | Mathur et al. | 364/163 |
| 5,408,586 A | 4/1995 | Skeirik | 395/23 |
| 5,414,645 A | 5/1995 | Hirano | 364/551.01 |
| 5,419,197 A | 5/1995 | Ogi et al. | 73/659 |
| 5,430,642 A | 7/1995 | Nakajima et al. | 364/148 |
| 5,434,774 A | 7/1995 | Seberger | 364/172 |
| 5,436,705 A | 7/1995 | Raj | 355/246 |
| 5,440,478 A | 8/1995 | Fisher et al. | 364/188 |
| 5,442,639 A | 8/1995 | Crowder et al. | 371/20.1 |
| 5,467,355 A | 11/1995 | Umeda et al. | 364/571.04 |
| 5,469,070 A | 11/1995 | Koluvek | 324/713 |
| 5,469,156 A | 11/1995 | Kogure | 340/870.38 |
| 5,469,735 A | 11/1995 | Watanabe | 73/118.1 |
| 5,469,749 A | 11/1995 | Shimada et al. | 73/861.47 |
| 5,481,199 A | 1/1996 | Anderson et al. | 324/705 |
| 5,481,200 A * | 1/1996 | Voegele et al. | 324/718 |
| 5,483,387 A | 1/1996 | Bauhahn et al. | 359/885 |
| 5,485,753 A | 1/1996 | Burns et al. | 73/720 |
| 5,486,996 A | 1/1996 | Samad et al. | 364/152 |
| 5,488,697 A | 1/1996 | Kaemmerer et al. | 395/51 |
| 5,489,831 A | 2/1996 | Harris | 318/701 |
| 5,495,769 A | 3/1996 | Broden et al. | 73/718 |
| 5,510,779 A | 4/1996 | Maltby et al. | 340/870.3 |
| 5,511,004 A | 4/1996 | Dubost et al. | 364/551.01 |
| 5,526,293 A | 6/1996 | Mozumder et al. | 364/578 |
| 5,539,638 A | 7/1996 | Keeler et al. | 364/424.03 |
| 5,548,528 A | 8/1996 | Keeler et al. | 364/497 |
| 5,560,246 A | 10/1996 | Bottinger et al. | 73/861.15 |
| 5,561,599 A | 10/1996 | Lu | 364/164 |
| 5,570,034 A | 10/1996 | Needham et al. | 324/763 |
| 5,570,300 A | 10/1996 | Henry et al. | 364/551.01 |
| 5,572,420 A | 11/1996 | Lu | 364/153 |
| 5,573,032 A | 11/1996 | Lenz et al. | 137/486 |
| 5,598,521 A | 1/1997 | Kilgore et al. | 395/326 |
| 5,600,148 A | 2/1997 | Cole et al. | 250/495.1 |
| 5,608,650 A | 3/1997 | McClendon et al. | 364/510 |
| 5,623,605 A | 4/1997 | Keshav et al. | 395/200.17 |
| 5,629,870 A | 5/1997 | Farag et al. | 364/551.01 |
| 5,637,802 A | 6/1997 | Frick et al. | 73/724 |
| 5,640,491 A | 6/1997 | Bhat et al. | 395/22 |
| 5,654,869 A | 8/1997 | Ohi et al. | 361/540 |
| 5,661,668 A | 8/1997 | Yemini et al. | 364/550 |
| 5,665,899 A | 9/1997 | Willcox | 73/1.63 |
| 5,669,713 A | 9/1997 | Schwartz et al. | 374/1 |
| 5,671,335 A | 9/1997 | Davis et al. | 395/23 |
| 5,675,504 A | 10/1997 | Serodes et al. | 364/496 |
| 5,675,724 A | 10/1997 | Beal et al. | 395/182.02 |
| 5,680,109 A | 10/1997 | Lowe et al. | 340/608 |
| 5,700,090 A | 12/1997 | Eryurek | 374/210 |
| 5,703,575 A | 12/1997 | Kirkpatrick | 340/870.17 |
| 5,704,011 A * | 12/1997 | Hansen et al. | 706/25 |
| 5,705,978 A | 1/1998 | Frick et al. | 340/511 |
| 5,708,585 A | 1/1998 | Kushion | 364/431.061 |
| 5,713,668 A | 2/1998 | Lunghofer et al. | 374/179 |
| 5,719,378 A | 2/1998 | Jackson, Jr. et al. | 219/497 |
| 5,741,074 A | 4/1998 | Wang et al. | 374/185 |
| 5,742,845 A | 4/1998 | Wagner | 395/831 |
| 5,746,511 A | 5/1998 | Eryurek et al. | 374/2 |
| 5,752,008 A | 5/1998 | Bowling | 395/500 |
| 5,764,891 A | 6/1998 | Warrior | 395/200.2 |
| 5,781,024 A | 7/1998 | Blomberg et al. | 324/763 |
| 5,781,878 A | 7/1998 | Mizoguchi et al. | 701/109 |
| 5,801,689 A | 9/1998 | Huntsman | 345/329 |
| 5,805,442 A | 9/1998 | Crater et al. | 364/138 |

| | | |
|---|---|---|
| 5,828,567 A | 10/1998 | Eryurek et al. ............... 700/79 |
| 5,828,876 A | 10/1998 | Fish et al. ..................... 374/1 |
| 5,848,383 A | 12/1998 | Yunus ......................... 702/102 |
| 5,859,964 A | 1/1999 | Wang et al. ........... 395/185.01 |
| 5,876,122 A | 3/1999 | Eryurek ....................... 374/183 |
| 5,880,376 A | 3/1999 | Sai et al. ................. 73/861.08 |
| 5,887,978 A | 3/1999 | Lunghofer et al. ......... 374/179 |
| 5,923,557 A | 7/1999 | Eidson .................. 364/471.03 |
| 5,924,086 A | 7/1999 | Mathur et al. ................ 706/25 |
| 5,926,778 A | 7/1999 | Pöppel ....................... 702/130 |
| 5,936,514 A | 8/1999 | Anderson et al. ...... 340/310.01 |
| 5,940,290 A * | 8/1999 | Dixon ............................. 700/9 |
| 5,956,663 A | 9/1999 | Eryurek et al. ............. 702/183 |
| 5,970,430 A | 10/1999 | Burns et al. ................. 702/122 |
| 6,014,902 A | 1/2000 | Lewis et al. ............. 73/861.12 |
| 6,016,523 A | 1/2000 | Zimmerman et al. ......... 710/63 |
| 6,016,706 A | 1/2000 | Yamamoto et al. ................. 9/6 |
| 6,017,143 A | 1/2000 | Eryurek et al. ............... 700/51 |
| 6,023,399 A | 2/2000 | Kogure ........................ 361/23 |
| 6,026,352 A | 2/2000 | Burns et al. ................. 702/182 |
| 6,038,579 A | 3/2000 | Sekine ....................... 708/400 |
| 6,045,260 A | 4/2000 | Schwartz et al. ........... 374/183 |
| 6,046,642 A | 4/2000 | Brayton et al. ............. 330/296 |
| 6,047,220 A | 4/2000 | Eryurek et al. ............... 700/28 |
| 6,047,222 A | 4/2000 | Burns et al. ................... 700/79 |
| 6,052,655 A | 4/2000 | Kobayashi et al. ......... 702/184 |
| 6,094,600 A | 7/2000 | Sharpe, Jr. et al. ........... 700/19 |
| 6,119,047 A | 9/2000 | Eryurek et al. ............... 700/28 |
| 6,151,560 A | 11/2000 | Jones ........................... 702/58 |
| 6,179,964 B1 | 1/2001 | Begemann et al. ......... 162/198 |
| 6,192,281 B1 | 2/2001 | Brown et al. ................... 700/2 |
| 6,195,591 B1 | 2/2001 | Nixon et al. .................. 700/83 |
| 6,199,018 B1 * | 3/2001 | Quist et al. ................... 702/34 |
| 6,263,487 B1 | 7/2001 | Stripf et al. ..................... 717/1 |
| 6,298,377 B1 | 10/2001 | Hartikainen et al. ........ 709/223 |
| 6,360,277 B1 | 3/2002 | Ruckley et al. ............. 709/250 |
| 6,377,859 B1 | 4/2002 | Brown et al. ................. 700/79 |
| 6,397,114 B1 * | 5/2002 | Eryurek et al. ............. 700/501 |
| 6,414,508 B1 * | 7/2002 | London ....................... 324/765 |
| 6,425,038 B1 | 7/2002 | Sprecher ..................... 710/269 |

FOREIGN PATENT DOCUMENTS

| | | |
|---|---|---|
| DE | 195 02 499 A1 | 8/1996 |
| DE | 296 00 609 U1 | 3/1997 |
| DE | 197 04 694 A1 | 8/1997 |
| DE | 19930660 A1 | 7/1999 |
| DE | 199 05 071 A1 | 8/2000 |
| DE | 299 17 651 U1 | 12/2000 |
| EP | 0 122 622 A1 | 10/1984 |
| EP | 0 413 814 A1 | 2/1991 |
| EP | 0 487 419 A2 | 5/1992 |
| EP | 0 512 794 A2 | 11/1992 |
| EP | 0 594 227 A1 | 4/1994 |
| EP | 0 624 847 A1 | 11/1994 |
| EP | 0 644 470 A2 | 3/1995 |
| EP | 0 825 506 A2 | 7/1997 |
| EP | 0 827 096 A2 | 9/1997 |
| EP | 0 838 768 A2 | 9/1997 |
| EP | 0 807 804 A2 | 11/1997 |
| EP | 1058093 A1 | 5/1999 |
| EP | 1022626 | 7/2000 |
| FR | 2 302 514 | 9/1976 |
| FR | 2 334 827 | 7/1977 |
| GB | 928704 | 6/1963 |
| GB | 1 534 280 | 11/1978 |
| GB | 2 310 346 A | 8/1997 |
| GB | 2 343 453 | 4/2000 |
| GB | 2 347 232 A | 8/2000 |
| JP | 58-129316 | 8/1983 |
| JP | 59-116811 | 7/1984 |
| JP | 59163520 | 9/1984 |
| JP | 59-111896 | 11/1984 |
| JP | 59-211196 | 11/1984 |
| JP | 60-507 | 1/1985 |
| JP | 60-76619 | 5/1985 |
| JP | 60-131495 | 7/1985 |
| JP | 60174915 | 9/1985 |
| JP | 62-30915 | 2/1987 |
| JP | 64-1914 | 1/1989 |
| JP | 64-72699 | 3/1989 |
| JP | 2-5105 | 1/1990 |
| JP | 03229124 | 10/1991 |
| JP | 5-122768 | 5/1993 |
| JP | 06242192 | 9/1994 |
| JP | 7-63586 | 3/1995 |
| JP | 07234988 | 9/1995 |
| JP | 8-54923 | 2/1996 |
| JP | 08102241 | 4/1996 |
| JP | 8-136386 | 5/1996 |
| JP | 8-166309 | 6/1996 |
| JP | 08247076 | 9/1996 |
| JP | 2712625 | 10/1997 |
| JP | 2712701 | 10/1997 |
| JP | 2753592 | 3/1998 |
| JP | 07225530 | 5/1998 |
| JP | 10-232170 | 9/1998 |
| JP | 11083575 | 3/1999 |
| WO | WO 94/25933 | 11/1994 |
| WO | WO 96/11389 | 4/1996 |
| WO | WO 96/12993 | 5/1996 |
| WO | WO 96/39617 | 12/1996 |
| WO | WO 97/21157 | 6/1997 |
| WO | WO 97/25603 | 7/1997 |
| WO | WO 98/06024 | 2/1998 |
| WO | WO 98/13677 | 4/1998 |
| WO | WO 98/14855 | 4/1998 |
| WO | WO 98/20469 | 5/1998 |
| WO | WO 98/39718 | 9/1998 |
| WO | WO 99/19782 | 4/1999 |
| WO | WO 00/55700 | 9/2000 |
| WO | WO 00/70531 | 11/2000 |
| WO | WO 02/27418 | 4/2002 |

OTHER PUBLICATIONS

"Approval Standards For Explosionproof Electrical Equipment General Requirements", Factory Mutual Research, Cl. No. 3615, Mar. 1989, pp. 1–34.

"Approval Standard Intrinsically Safe Apparatus and Associated Apparatus For Use In Class I, II, and III, Division 1 Hazardous (Classified) Locations", Factory Mutual Research, Cl. No. 3610, Oct. 1988, pp. 1–70.

"Automation On–line" by, Phillips et al., Plant Services, Jul. 1997, pp. 41–45.

"Climb to New Heights by Controlling your PLCs Over the Internet" by, Phillips et al., Intech, Aug. 1998, pp. 50–51.

"CompProcessor For Piezoresistive Sensors" MCA Technologies Inc. (MCA7707), pp. 1–8.

"Ethernet emerges as viable, inexpensive fieldbus", Paul G. Schreier, Personal Engineering, Dec. 1997, p. 23–29.

"Ethernet Rules Closed–loop System" by, Eidson et al., Intech, Jun. 1998, pp. 39–42.

"Fieldbus Standard for Use in Industrial Control Systems Part 2: Physical Layer Specification and Service Definition", ISA–S50.02–1992, pp. 1–93.

"Fieldbus Standard for Use in Industrial Control Systems Part 3: Data Link Service Definition", ISA–S50.02–1997, Part 3, Aug. 1997, pp. 1–159.

Fieldbus Standard For Use in Industrial Control Systems Part 4: Data Link Protocol Specification, ISA–S50.02–1997, Part 4, Aug. 1997, pp. 1–148.

"Fieldbus Support For Process Analysis" by, Blevins et al., Fisher–Rosemount Systems, Inc., 1995, pp. 121–128.

"Fieldbus Technical Overview Understanding FOUNDATION™ fieldbus technology", Fisher–Rosemount, 1998, pp. 1–23.

"Hypertext Transfer Protocol—HTTP/1.0" by, Berners–Lee et al., MIT/LCS, May 1996, pp. 1–54.

"Infranets, Intranets, and the Internet" by, Pradip Madan, Echelon Corp, Sensors, Mar. 1997, pp. 46–50.

"Internet Technology Adoption into Automation" by, Fondl et al., Automation Business, pp. 1–5.

"Internet Protocol Darpa Internet Program Protocol Specification" by, Information Sciences Institute, University of Southern California, RFC 791, Sep. 1981, pp. 1–43.

"Introduction to Emit", emWare, Inc., 1997, pp. 1–22.

"Introduction to the Internet Protocols" by, Charles L. Hedrick, Computer Science Facilities Group, Rutgers University, Oct. 3, 1988, pp. 1–97.

"Is There A Future For Ethernet in Industrial Control?", Miclot et al., Plant Engineering, Oct. 1988, pp. 44–46, 48, 50.

LFM/SIMA Internet Remote Diagnostics Research Project Summary Report, Stanford University, Jan. 23, 1997, pp. 1–6.

"Managing Devices with the Web" by, Howard et al., Byte, Sep. 1997, pp. 45–64.

"Modular Microkernel Links GUI And Browser For Embedded Web Devices" by, Tom Williams, pp. 1–2.

"PC Software Gets Its Edge From Windows, Components, and the Internet", Wayne Labs, I&CS, Mar. 1997, pp. 23–32.

Proceedings Sensor Expo, Aneheim, California, Produced by Expocon Management Associates, Inc., Apr. 1996, pp. 9–21.

Proceedings Sensor Expo, Boston, Massachuttes, Produced by Expocon Management Associates, Inc., May 1997, pp. 1–416.

"Smart Sensor Network of the Future" by, Jay Warrior, Sensors, Mar. 1997, pp. 40–45.

"The Embedded Web Site" by, John R. Hines, IEEE Spectrum, Sep. 1996, p. 23.

"Transmission Control Protocol: Darpa Internet Program Protocol Specification" Information Sciences Institute, Sep. 1981, pp. 1–78.

"On–Line Statistical Process Control for a Glass Tank Ingredient Scale," by R.A. Weisman, *IFAC real Time Programming*, 1985, pp. 29–38.

"The Performance of Control Charts for Monitoring Process Variation," by C. Lowry et al., *Commun. Statis.—Simula.*, 1995, pp. 409–437.

"A Knowledge–Based Approach for Detection and Diagnosis of Out–Of–Control Events in Manufacturing Processes," by P. Love et al., *IEEE*, 1989, pp. 736–741.

"Advanced Engine Diagnostics Using Universal Process Modeling", by P. O'Sullivan, *Presented at the 1996 SAE Conference on Future Transportation Technology*, pp. 1–9.

Parallel, Fault–Tolerant Control and Diagnostics System for Feedwater Regulation in PWRS, by E. Eryurek et al., *Proceedings of the American Power Conference*.

"Programmable Hardware Architectures for Sensor Validation", by M.P. Henry et al., *Conrol Eng. Practice*, vol. 4, No. 10., pp. 1339–1354, (1996).

"Sensor Validation for Power Plants Using Adaptive Backpropagation Neural Network," *IEEE Transactions on Nuclear Science*, vol. 37, No. 2, by E. Eryurek et al. Apr. 1990, pp. 1040–1047.

"Single Processing, Data Handling and Communications: The Case for Measurement Validation", by M.P. Henry, *Department of Engineering Science, Oxford University*.

"Smart Temperature Measurement in the '90s", by T. Kerlin et al., *C& I*, (1990).

"Software–Based Fault–Tolerant Control Design for Improved Power Plant Operation," *IEEE/IFAC Joint Symposium on Computer–Aided Control System Design*, Mar. 7–9, 1994 pp. 585–590.

A Standard Interface for Self–Validating Sensors, by M.P. Henry et al., *Report No. QUEL 1884/91*, (1991).

"Taking Full Advantage of Smart Transmitter Technology Now," by G. Orrison, *Control Engineering*, vol. 42, No. 1, Jan. 1995.

"Using Artificial Neural Networks to Identify Nuclear Power Plant States," by Israel E. Alguindigue et al., pp. 1–4.

"Application of Neural Computing Paradigms for Signal Validation," by B.R. Upadhyaya et al., *Department of Nuclear Engineering*, pp. 1–18.

"Application of Neural Networks for Sensor Validation and Plant Monitoring," by B. Upadhyaya et al., *Nuclear Technology*, vol. 97, No. 2, Feb. 1992 pp. 170–176.

"Automated Generation of Nonlinear System Characterization for Sensor Failure Detection," by. B.R. Upadhyaya et al., *ISA*, 1989 pp. 269–274.

"In Situ Calibration of Nuclear Plant Platinum Resistance Thermometers Using Johnson Noise Methods," *EPRI*, Jun. 1983.

"Johnson Noise Thermometer for High Radiation and High–Temperature Environments," by L. Oakes et al., *Fifth Symposium on Space Nuclear Power Systems*, Jan. 1988, pp. 2–23.

"Development of a Resistance Thermometer For Use Up to 1600°C", by M.J. de Groot et al., *CAL LAB*, Jul./Aug. 1996, pp. 38–41.

"Survey, Applications, And Prospects of Johnson Noise Thermometry," by T. Blalock et al., *Electrical Engineering Department*, 1981 pp. 2–11.

"Noise Thermometry for Industrial and Metrological Applications at KFA Julich," by H. Brixy et al., *7th International Symposium on Temperature*, 1992.

"Johnson Noise Power Thermometer and its Application in Process Temperature Measurement," by T.V. Blalock et al., *American Institute of Physics* 1982, pp. 1249–1259.

"Field–based Architecture is Based on Open Systems, Improves Plant Performance", by P. Cleaveland, *I&CS*, Aug. 1996, pp. 73–74.

"Tuned–Circuit Dual–Mode Johnson Noise Thermometers," by R.L. Shepard et al., Apr. 1992.

"Tuned–Circuit Johnson Noise Thermometry," by Michael Roberts et al., $7^{th}$ *Symposium on Space Nuclear Power Systems*, Jan. 1990.

"Smart Field Devices Provide New Process Data, Increase System Flexibility," by Mark Boland, *I&CS*, Nov. 1994, pp. 45–51.

"Wavelet Analysis of Vibration, Part I: Theory[1]," by D.E. Newland, *Journal of Vibration and Acoustics*, vol. 116, Oct. 1994, pp. 409–416.

"Wavelet Analysis of Vibration, Part 2: Wavelet Maps," by D.E. Newland, *Journal of Vibration and Acoustics*, vol. 116, Oct. 1994, pp. 417–425.

"Development of a Long–Life, High–Reliability Remotely Operated Johnson Noise Thermometer," by R.L. Shepard et al., *ISA*, 1991, pp. 77–84.

"Application of Johnson Noise Thermometry to Space Nuclear Reactors," by M.J. Roberts et al., *Presented at the 6th Symposium on Space Nuclear Power Systems*, Jan. 9–12, 1989.

"A Decade of Progress in High Temperature Johnson Noise Thermometry," by T.V. Blalock et al., *American Institute of Physics*, 1982 pp. 1219–1223.

"Sensor and Device Diagnostics for Predictive and Proactive Maintenance", by B. Boynton, *A Paper Presented at the Electric Power Research Institute—Fossil Plant Maintenance Conference* in Baltimore, Maryland, Jul. 29–Aug. 1, 1996, pp. 50–1–50–6.

"Detection of Hot Spots in Thin Metal Films Using an Ultra Sensitive Dual Channel Noise Measurement System," by G.H. Massiha et al., *Energy and Information Technologies in the Southeast*, vol. 3 of 3, Apr. 1989, pp. 1310–1314.

"Detecting Blockage in Process Connections of Differential Pressure Transmitters", by E. Taya et al., *SICE*, 1995, pp. 1605–1608.

"Development and Application of Neural Network Algorithms For Process Diagnostics," by B.R. Upadhyaya et al., *Proceedings of the 29th Conference on Decision and Control*, 1990, pp. 3277–3282.

"A Fault–Tolerant Interface for Self–Validating Sensors", by M.P. Henry, *Colloquium*, pp. 3/1–3/2 (Nov. 1990).

"Fuzzy Logic and Artificial Neural Networks for Nuclear Power Plant Applications," by R.C. Berkan et al., *Proceedings of the American Power Conference*.

"Fuzzy Logic and Neural Network Applications to Fault Diagnosis", by P. Frank et al., *International Journal of Approximate Reasoning*, (1997), pp. 68–88.

"Keynote Paper: Hardware Compilation–A New Technique for Rapid Prototyping of Digital Systems–Applied to Sensor Validation", by M.P. Henry, *Control Eng. Practice*, vol. 3, No. 7., pp. 907–924, (1995).

"The Implications of Digital Communications on Sensor Validation", by M. Henry et al., *Report No. QUEL 1912/92*, (1992).

"In–Situ Response Time Testing of Thermocouples", *ISA*, by H.M. Hashemian et al., Paper No. 89–0056, pp. 587–593, (1989).

"An Integrated Architecture For Signal Validation in Power Plants," by B.R. Upadhyaya et al., *Third IEEE International Symposium on Intelligent Control*, Aug. 24–26, 1988, pp. 2–6.

"Integration of Multiple Signal Validation Modules for Sensor Monitoriong," by B. Upadhyaya et al., *Department of Nuclear Engineering*, Jul. 8, 1990, pp. 1–6.

"Intelligent Behavior for Self–Validating Sensors", by M.P. Henry, *Advances In Measurement*, pp. 1–7, (May 1990).

"Measurement of the Temperature Fluctuation in a Resistor Generating 1/F Fluctuation," by S. Hashiguchi, *Japanese Journal of Applied Physics*, vol. 22, No. 5, Part 2, May 1983, pp. L284–L286.

"Check of Semiconductor Thermal Resistance Elements by the Method of Noise Thermometry", by A. B. Kisilevskii et al., *Measurement Techniques*, vol. 25, No. 3, Mar. 1982, New York, USA, pp. 244–246.

"Neural Networks for Sensor Validation and Plant Monitoring," by B. Upadhyaya, *International Fast Reactor Safety Meeting*, Aug. 12–16, 1990, pp. 2–10.

"Neural Networks for Sensor Validation and Plantwide Monitoring," by E. Eryurek, 1992.

"A New Method of Johnson Noise Thermometry", by C.J. Borkowski et al., *Rev. Sci. Instrum.*, vol. 45, No. 2, (Feb. 1974) pp. 151–162.

"Thermocouple Continuity Checker," IBM Technical Disclosure Bulletin, vol. 20, No. 5, pp. 1954 (Oct. 1977).

"A Self–Validating Thermocouple," Janice C–Y et al., IEEE Transactions on Control Systems Technology, vol. 5, No. 2, pp. 239–253 (Mar. 1997).

*Instrument Engineers' Handbook*, Chapter IV entitled "Temperature Measurements," by T.J. Claggett, pp. 266–333 (1982).

"emWare's Releases EMIT 3.0, Allowing Manufacturers to Internet and Network Enable Devices Royalty Free," 3 pages, PR Newswire (Nov. 4, 1998).

Warrior, J., "The IEEE P1451.1 Object Model Network Independent Interfaces for Sensors and Actuators," pp. 1–14, Rosemount Inc. (1997).

Warrior, J., "The Collision Between the Web and Plant Floor Automation," $6^{Th}$. WWW Conference Workshop on Embedded Web Technology, Santa Clara, CA (Apr. 7, 1997).

Microsoft Press Computer Dictionary, $3^{rd}$ Edition, p. 124.

"Internal Statistical Quality Control for Quality Monitoring Instruments", by P. Girling et al., *ISA*, 15 pgs., 1999.

Web Pages from www.triant.com (3 pgs.).

"Statistical Process Control (Practice Guide Series Book)", *Instrument Society of America*, 1995, pp. 1–58 and 169–204.

"Time–Frequency Analysis of Transient Pressure Signals for a Mechanical Heart Valve Cavitation Study," *ASAIO Journal*, by Alex A. Yu et al., vol. 44, No. 5, pp. M475–M479, (Sep.—Oct. 1998).

"Transient Pressure Signals in Mechanical Heart Valve Caviation,"by Z.J. Wu et al., pp. M555–M561 (undated).

"Caviation in Pumps, Pipes and Valves," *Process Engineering*, by Dr. Ronald Young, pp. 47 and 49 (Jan. 1990).

"Quantification of Heart Valve Cavitation Based on High Fidelity Pressure Measurements," *Advances in Bioengineering 1994*, by Laura A. Garrison et al., BED–vol. 28, pp. 297–298 (Nov. 6–11, 1994).

"Monitoring and Diagnosis of Cavitation in Pumps and Valves Using the Wigner Distribution," *Hydroaccoustic Facilities, Instrumentation, and Experimental Techniques*, NCA–vol. 10, pp. 31–36 (1991).

"Developing Predictive Models for Cavitation Erosion," *Codes and Standards in A Global Environment*, PVP–vol. 259, pp. 189–192 (1993).

"Self–Diagnosing Intelligent Motors: A Key Enabler for Next Generation Manufacturing System," by Fred M. Discenzo et al., pp. 3/1–3/4 (1999).

"A Microcomputer–Based Instrument for Applications in Platinum Resistance Thermomety," by H. Rosemary Taylor and Hector A. Navarro, Journal of Physics E. Scientific Instrument, vol. 16, No. 11, pp. 1100–1104 (1983).

"Experience in Using Estelle for the Specification and Verification of a Fieldbus Protocol: FIP," by Barretto et al., Computer Networking, pp. 295–304 (1990).

"Computer Simulation of H1 Field Bus Transmission," by Utsumi et al., Advances in Instrumentation and Control, vol. 46, Part 2, pp. 1815–1827 (1991).

"Progress in Fieldbus Developments for Measuring and Control Application," by A. Schwaier, Sensor and Actuators, pp. 115–119 (1991).

"Ein Emulationssystem zur Leistungsanalyse von Feldbussystemen, Teil 1," by R. Hoyer, pp. 335–336 (1991).

"Simulatore Integrato: Controllo su bus di campo," by Barabino et al., Automazione e Strumentazione, pp. 85–91 (Oct. 1993).

"Ein Modulares, verteiltes Diagnose–Expertensystem füs die Fehlerdiagnose in lokalen Netzen," by Jürgen M. Schröder, pp. 557–565 (1990).

"Fault Diagnosis of Fieldbus Systems," by Jürgen Quade, pp. 577–581 (Oct. 1992).

"Ziele und Anwendungen von Feldbussystemen," by T. Pfeifer et al., pp. 549–557 (Oct. 1987).

"PROFIBUS–Infrastrukturmaβnahmen," by Tilo Pfeifer et al., pp. 416–419 (Aug. 1991).

"Simulation des Zeitverhaltens von Feldbussystemen," by O. Schnelle, pp. 440–442 (1991).

"Modélisation et simulation d'un bus de terrain: FIP," by Song et al., pp. 5–9 (undated).

"Feldbusnetz für Automatisierungssysteme mit intelligenten Funktionseinheiten," by W. Kriesel et al., pp. 486–489 (1987).

"Bus de campo para la inteconexión del proceso con sistemas digitales de control," Tecnología, pp. 141–147 (1990).

"Dezentrale Installation mit Echtzeit–Feldbus," Netzwerke, Jg. Nr.3 v. 14.3, 4 pages (1990).

"Process Measurement and Analysis," by Liptak et al., Instrument Engineers' Handbook, Third Edition, pp. 528–530, (1995).

U.S. Appl. No. 09/169,873, filed Oct. 12, 1998, Eryurek et al.

U.S. Appl. No. 09/175,832, filed Oct. 19, 1998, Eryurek et al.

U.S. Appl. No. 09/257,896, filed Feb. 25, 1999, Eryurek et al.

U.S. Appl. No. 09/303,869, filed May 3, 1999, Eryurek et al.

U.S. Appl. No. 09/335,212, filed Jun. 17, 1999, Kirkpatrick et al.

U.S. Appl. No. 09/344,631, filed Jun. 25, 1999, Eryurek et al.

U.S. Appl. No. 09/360,473, filed Jul. 23, 1999, Eryurek et al.

U.S. Appl. No. 09/369,530, filed Aug. 6, 1999, Eryurek et al.

U.S. Appl. No. 09/383,828, filed Aug. 27, 1999, Eryurek et al.

U.S. Appl. No. 09/384,876, filed Aug. 27, 1999, Eryurek et al.

U.S. Appl. No. 09/406,263, filed Sep. 24, 1999, Kirkpatrick et al.

U.S. Appl. No. 09/409,098, filed Sep. 30, 1999, Eryurek et al.

U.S. Appl. No. 09/409,114, filed Sep. 30, 1999, Eryurek et al.

U.S. Appl. No. 09/565,604, filed May 4, 2000, Eruyrek et al.

U.S. Appl. No. 09/576,450, filed May 23, 2000, David L. Wehrs.

U.S. Appl. No. 09/576,719, filed May 23, 2000, Coursolle.

U.S. Appl. No. 09/606,259, filed Jun. 29, 2000, Evren Eryurek.

U.S. Appl. No. 09/616,118, filed Jul. 14, 2000, Eryurek et al.

U.S. Appl. No. 09/627,543, filed Jul. 28, 2000, Eryurek et al.

"Improving Dynamic Performance of Temperature Sensors With Fuzzy Control Techniques," by Wang Lei et al., pp. 872–873 (1992).

U.S. Appl. No. 09/855,179, filed May 14, 2001, Eryurek et al.

"Microsoft Press Computer Dictionary" 2nd Edition, 1994, Microsoft Press. p. 156.

U.S. Appl. No. 09/852,102, filed May 9, 2001, Eryurek et al.

Copy of International Search Report from Application No. PCT/US01/40791 with international filing date of May 22, 2001.

Copy of International Search Report from Application No. PCT/US01/40782 with international filing date of May 22, 2001.

"On–Line Tool Condition Monitoring System With Wavelet Fuzzy Neural Network," by Li Xiaoli et al., pp. 271–276 (1997).

Copy of International Search Report from Application No. PCT/US02/14934 with international filing date of May 8, 2002.

Copy of International Search Report from Application No. PCT/US02/14560 with international filing date of May 8, 2002.

* cited by examiner

ELECTRONICS BOARD LIFE PREDICTION OF MICROPROCESSOR-BASED TRANSMITTERS

CROSS-REFERENCE TO RELATED APPLICATIONS

This application is related to U.S. Pat. No. 5,481,200, entitled FIELD TRANSMITTER BUILT-IN TEST EQUIPMENT, issued Jan. 2, 1996, herein incorporated by reference.

BACKGROUND OF THE INVENTION

The present invention relates to operating in the process control industry. In particular, the present invention relates to electronics board life prediction of microprocessor-based field devices based upon repeated measurements of the current drawn by the electronics board.

Efficient manipulation of a process variable in a controlled process requires that faults, in a field device's components or communication circuits, be identified immediately so that appropriate corrective action or appropriate warnings may be implemented. Verification of a malfunction or error prior to stopping the process and removing a field device from a process loop provides inherent efficiency. Present microprocessor-based transmitters contain complex electrical circuits that sometimes appear to have failed, while actually only a leakage or shunted electrical current has occurred. For example, a circuit leakage current that affects loop current may be reported as a transmitter fault.

U.S. Pat. No. 5,481,200 teaches a field transmitter with built-in test equipment. One aspect of the field transmitter includes deriving the current drawn by the electronics of the transmitter and using the derived current to provide a diagnostic output related to the transmitter electronics. The present invention is an improvement upon the teachings set forth in U.S. Pat. No. 5,481,200. As will be apparent later in the specification, embodiments of the present invention allow earlier detection of problem situations and thereby facilitate more effective corrective action.

SUMMARY OF THE INVENTION

A field device includes circuitry to successively measure a parameter related to current drawn by electronics of the field device. The measurements are provided to a prediction engine which calculates a diagnostic output based upon the plurality of current-related measurements. The diagnostic prediction provided by the prediction engine can provide an estimate of viable life remaining for the device electronics. The diagnostic feature provides on-line status of the overall health of the electronics board of the field transmitter.

DETAILED DESCRIPTION OF THE PREFERRED EMBODIMENTS

Process variables are typically the primary variables which are being controlled in a process. As used herein, process variable means any variable which describes the condition of the process such as, for example, pressure, flow, temperature, value, level, pH, turbidity, vibration, position, motor current, or any other characteristic of the process, etc. Control signal means any signal (other than a process variable) which is used to control the process. For example, a control signal includes a desired process variable value (i.e. a setpoint) such as a desired temperature, pressure, flow, level, pH or turbidity, etc., which is adjusted by a controller. Additionally, a control signal includes calibration values, alarms, alarm conditions, the signal which is provided to a control element such as a valve position signal which in turn is provided to a valve actuator, to a heating element, a solenoid on/off signal, etc., or any other signal which relates to control of the process. A diagnostic signal as used herein includes information related to operation of devices and elements in the process control loop, but does not include process variables or control signals. For example, diagnostic signals include valve stem position, applied torque or force, actuator pressure, pressure of a pressurized gas used to actuate a valve, electrical voltage, current, power, resistance, capacitance, inductance, device temperature, stiction, friction, full on and off positions, travel, frequency, amplitude, spectrum and spectral components, stiffness, electric or magnetic field strength, duration, intensity, motion, electric motor back emf, motor current, loop related parameters (such as control loop resistance, voltage, or current), or any other parameter which may be detected or measured in the system. Furthermore, process signal includes any signal which is related to the process or element in the process such as, for example, a process variable, a control signal or a diagnostic signal. Field devices include any device which forms part of or couples to a process control loop and is used in the control or monitoring of a process.

Figure 1:
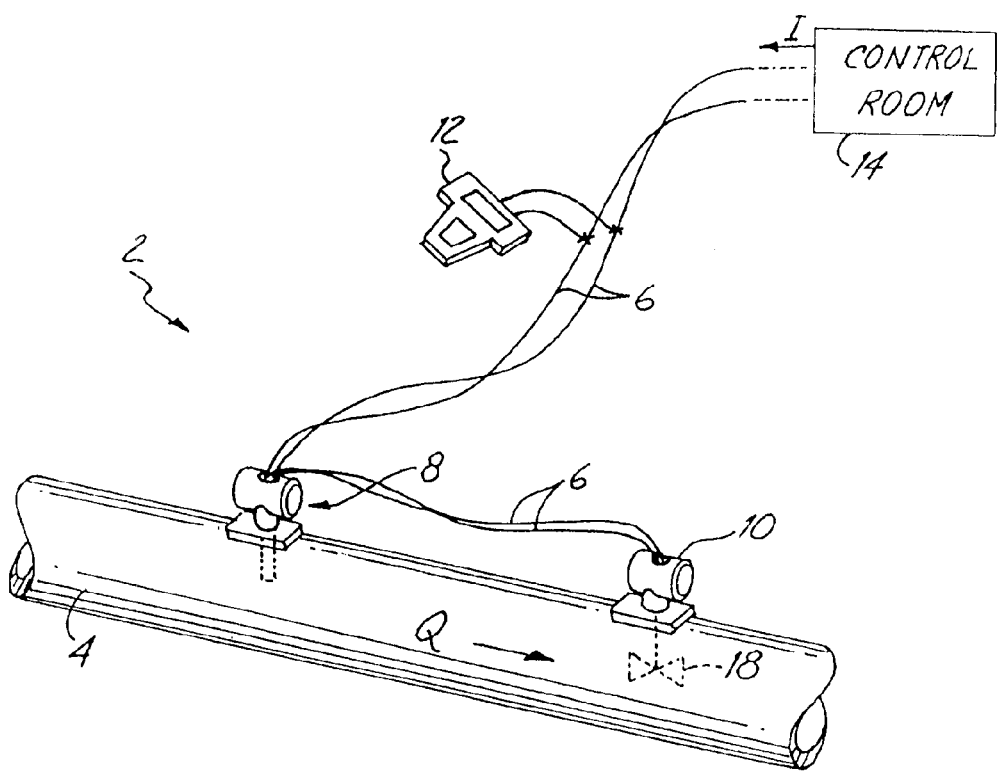
FIG. 1 is a diagrammatic view of a process control system with which embodiments of the present invention are particularly useful.

FIG. 1 is a diagram showing an example of a process control system 2 which includes process piping 4 which carries a process fluid and two wire process control loop 6 carrying loop current I. A field device 8, controller 10, which couples to a final control element in the loop such as an actuator, valve, a pump, motor or solenoid, communicator 12, and control room 14 are all part of process control loop 6. The process variable may be received by controller/valve actuator 10, communicator 12 and/or control room equipment 14. Controller 10 is shown coupled to valve 18 and is capable of controlling the process by adjusting valve 18 thereby changing the flow, Q, in pipe 4. Controller 10 receives a control input over loop 6 from, for example, control room 14, transmitter 8 or communicator 12 and responsively adjusts valve 18. In another embodiment, controller 10 internally generates the control signal based upon process signals H receives over loop 6. Communicator 12 may be the portable communicator shown in FIG. 1 or may be a permanently mounted process unit which monitors the process and performs computations. "Field devices" include, for example, transmitter 8 (such as a 3095 transmitter available from Rosemount Inc.), controller 10, communicator 12 and control room 14 shown in FIG. 1.

Embodiments of the present invention focus upon the electronics board of a microprocessor-based field device.

Embodiments of the present invention are useful for any field device in the process control system that is powered by a 4–20 mA signal. The diagnostics feature of embodiments of the present invention provides on-line status of the overall electronics of the field device by monitoring the total electronic supply current. As the supply current increases to critical levels, it may degrade the electronics, communications protocol, and analog output range of the transmitter. See, for example, U.S. Pat. No. 5,481,200. The diagnostic feature disclosed herein, in accordance with embodiments of the present invention, provides the user with predictive analysis of device electronics by estimating the remaining time until the supply current reaches a predetermined critical level. Those skilled in the art will recognize that estimating the remaining time until the supply current reaches a predetermined critical level is merely one way in which multiple measurements related to electronics supply current can be related to a predictive diagnostic output.

Figure 2:
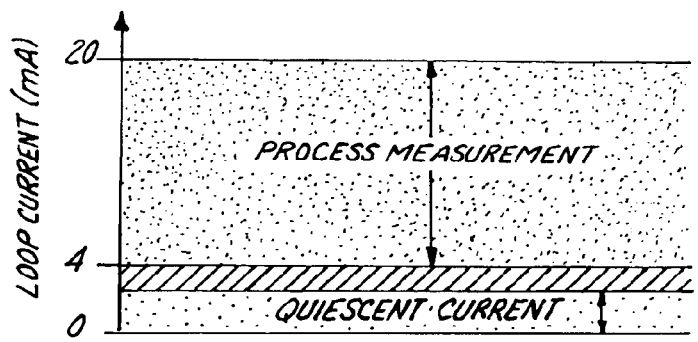
FIG. 2 is a chart indicating current allocation of the process control loop current for a typical 4–20 mA field device.

FIG. 2 illustrates current allocation of the process control loop current for a typical 4–20 mA field device. Generally, the supply current, or quiescent current ($I_Q$) of the electronics is a constant Direct Current (DC) value below the 4 mA bound. As shown in FIG. 2 the remaining 16 mA is reserved to realize the complete range of values for a given process measurement. Under normal operating conditions the quiescent current will increase slightly from its nominal value as electrical currents draw more supply current to perform specific functions. For example, one such task that requires substantial energy is a data writing operation with non-volatile memory. Furthermore, $I_Q$ may be effected by ambient conditions such as temperature or humidity.

Abnormal conditions can cause $I_Q$ to rise to a level above 4 mA, which level will affect the output range of a field device. Ambient conditions can increase $I_Q$ by influencing the performance of electrical components therein (i.e., passive elements or integrated circuits). Therefore, if the field device is located in the harsh environment for an extended period of time, the degradation of electrical components may be accelerated or other electrical faults such as leakage path or shunt current to ground may occur. As an example, if an electrical fault occurs such that the DC value of $I_Q$ becomes 6 mA, for example, the loop current will then be incapable of being less than 6 mA. Even with this fault in the electronics, the transmitter may function normally (sensor, microprocessor, communications, etc. are all functional) for process measurements within the 6–20 mA range. Conversely, if process measurement is between 4–6 mA, the operator or the process control instrumentation using the analog output signal will receive inaccurate data.

Embodiments of the present invention employ a prediction engine that acquires data related to a sequence of supply current measurements and calculates the time remaining before the supply current ($I_Q$) reaches a preselected upper limit. Essentially, a field device equipped with this predictive diagnostics, in accordance with embodiments of the present invention will predict the life of its own electronics board. This not only forewarns the user of a possible malfunction, but provides the user additional time to either replace the transmitter or its electronics board before jeopardizing the performance of a particular process control loop or the process itself.

Figure 3:
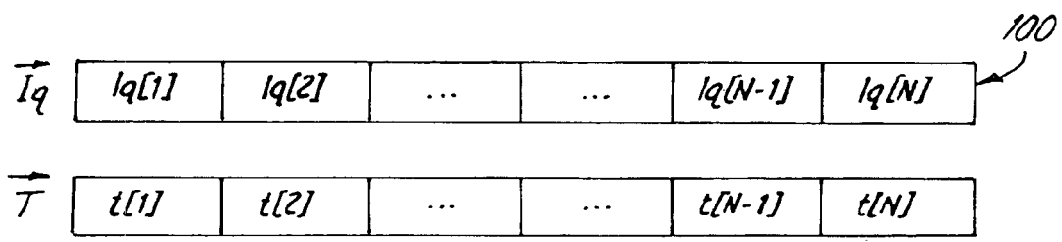
FIG. 3 is a diagrammatic view of a pair of arrays useful with an embodiment of the present invention.

FIG. 3 illustrates a data structure which facilitates realization of embodiments of the present invention. Specifically, a pair of arrays of length N are shown. During diagnostics, a parameter related to supply current, or even the supply current itself is sampled and stored as an $I_Q$ value in array 100. This process is repeated periodically until array 100 is filled with a predetermined number (N) of $I_Q$ values. Conceptually, this set of $I_Q$ values is an array, but may be modelled and/or stored in any number of formats. A similar array, T, corresponds to the time at which each $I_Q$ value was sampled. These values are preferably stored in non-volatile memory. Once both arrays are full, the contents of the arrays are provided to a prediction engine which is preferably embodied within software running on the microprocessor. The prediction engine applies a curve-fit to the sample of $I_Q$ values against time, as represented array (T) and generates coefficients for a continuous-time equation $I_Q(t)$. If an upper limit for $I_Q$ is set at 4 mA, for example, the prediction engine uses the coefficients of $I_Q(t)$ to calculate the absolute time ($T_{ABS-LIFE}$) until $I_Q=I_{QMAX}$. Since $T_{ABS-LIFE}$ is referenced from an initial value of time $T_0(T[1])$, the actual remaining time is the difference from $T_{ABS-LIFE}$ and t[N]. This time is referred to as the electronics board life.

Figure 4:
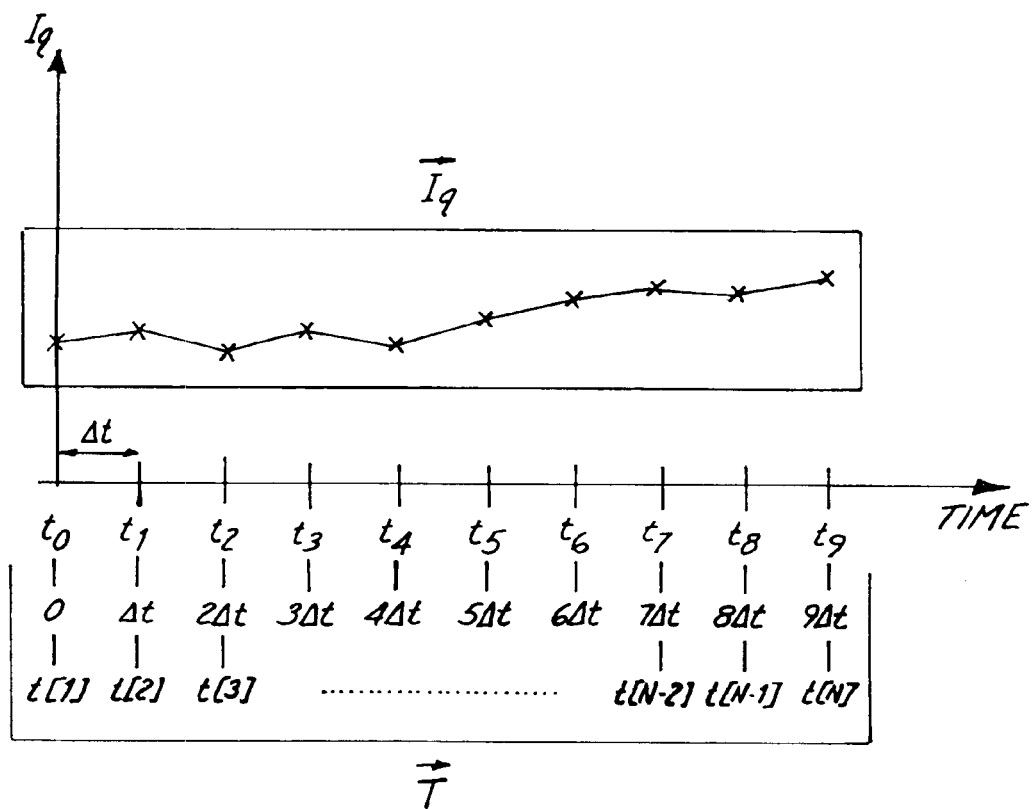
FIG. 4 is a chart illustrating a number of current values and their relationship to the arrays illustrated in FIG. 3.

FIG. 4 illustrates a number of $I_Q$ values obtained at various times t. As illustrated, the period between each sample is preferably constant in order to simplify calculations. However, it is contemplated that the period between measurements can be varied based upon any number of factors, including the calculated electronics board life, as well as the rate of change of calculated electronics board life, for example.

Figure 5:
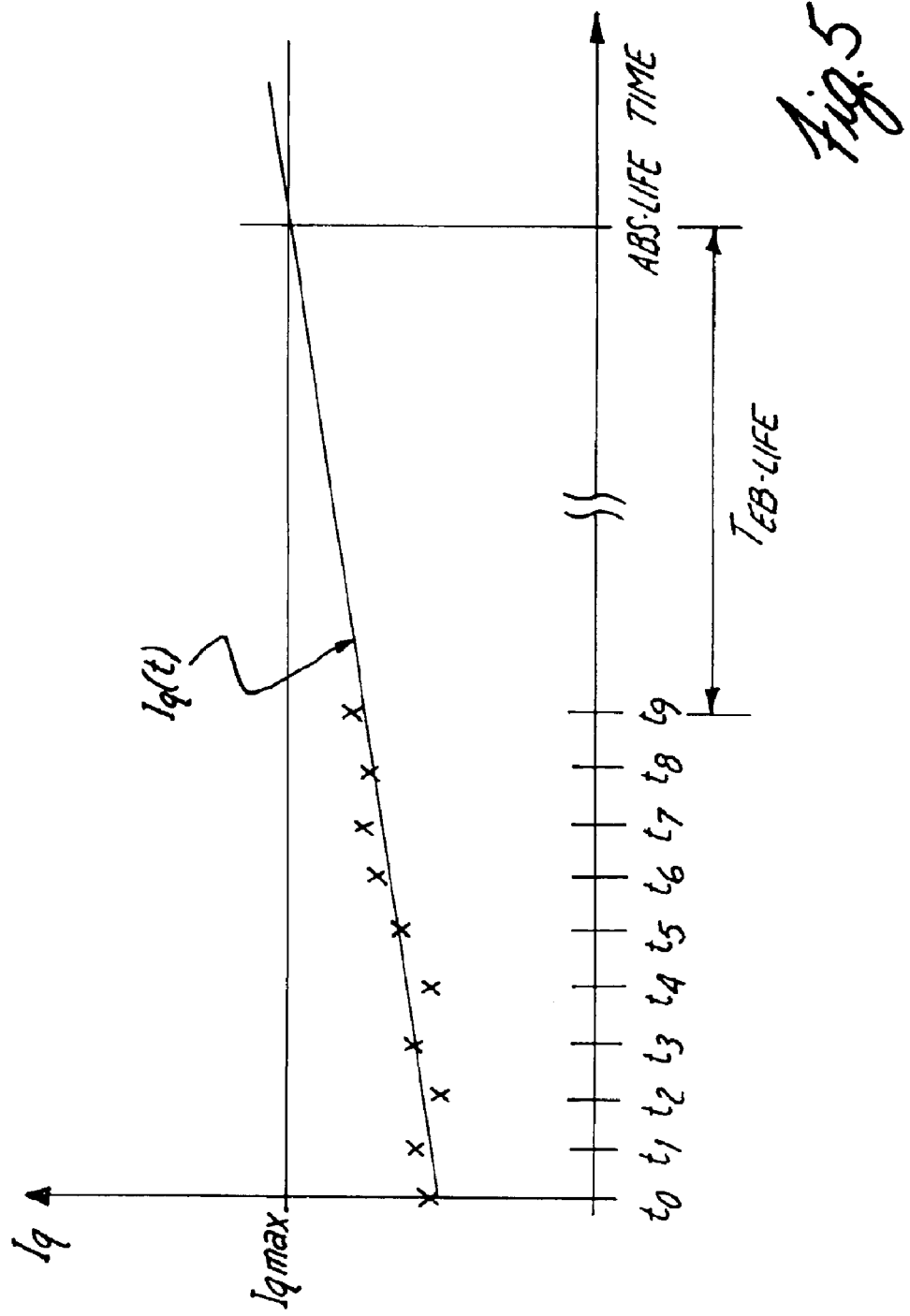
FIG. 5 is a chart illustrating calculation of electronic board life prediction using a linear curve fit.

FIG. 5 is a chart illustrating calculation of electronics board life prediction. As an example, for an arbitrary value of N, such as 10, arrays $I_Q$ and T will be full at $t=T_9$ (see FIG. 3). At this time, the prediction engine will calculate the following:

$$I_q(t) \rightarrow t(I_q)$$

$$T_{ABS-Life} = t(I_{q-max}) \quad \text{EQ. 1}$$

$$T_{EB-Life} = t(I_{q-max}) - t[N] \quad \text{EQ. 2}$$

In this embodiment, the prediction engine selects a linear curve fit to represent $I_Q(t)$ and the calculation of $T_{EB-LIFE}$ is illustrated in FIG. 5. Those skilled in the art will recognize that a number of methods for correlating the data points contained in the array, or other data structure, to a prediction diagnostic output can be provided and such methods are contemplated. For example, non-linear relationships can also be used. Further, neural network analysis techniques and/or fuzzy logic relationships can be used to relate the measured supply current parameters to a diagnostic output such as remaining lifetime of the electronics board.

Since the sample size N is fixed, each element in the array needs to be shifted before the next value of $I_Q$ can be sampled. This is known as a first-in first-out regime. Thus, the last element of the array will be replaced by the next value of $I_Q$. Thus, $$I_q[K] = I_q[k+1] \text{ for } k=1 \text{ to } N-1 \quad \text{EQ. 3}$$

$$I_q[N] = \text{next } I_q \text{ reading} \quad \text{EQ. 4}$$

Figure 6:
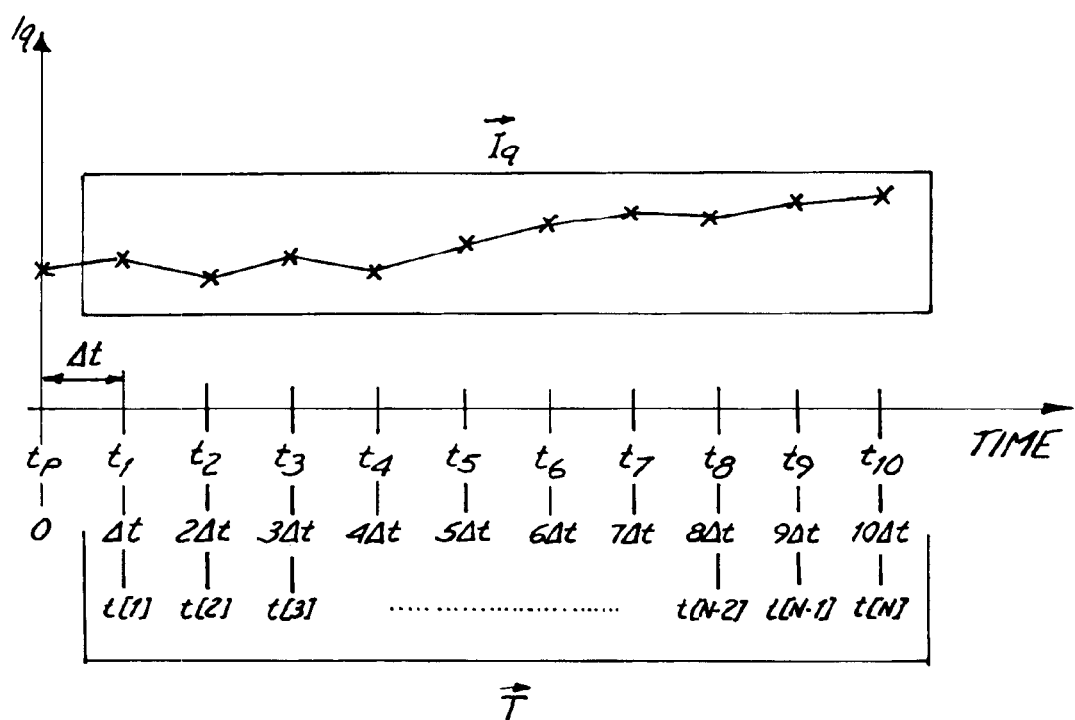
FIG. 6 illustrates a second set of current values obtained after a time Δt.

Hence, the $I_Q$ array acts life a FIFO (First-In First-Out) array or a queue. In a similar manner, FIG. 6 illustrates the acquisition of a next set of values for $I_Q$ and T for N=10 ($T_0$–0). As discussed above, of the previous values of $I_Q$ are shifted in the array and a new value of $I_Q$ is acquired at $T_{10}$. With the acquisition of $T_{10}$, the prediction engine is again invoked and the calculation of the electronics board life is predicted as set forth above. Preferably, electronics board life prediction is performed periodically. However, electronics board life prediction can also be manually invoked either by a local user interface at the field device itself, or by sending a suitable communication signal to the field device over a control loop.

Although the present invention has been described with reference to preferred embodiments, workers skilled in the art will recognize that changes may be made in form and detail without departing from the spirit and scope of the invention.

What is claimed is:

1. A field device, having two terminals coupleable to a 4–20 mA process control loop, the field device comprising:
   device electronics drawing a supply current from the 4–20 mA process control loop;
   supply current measurement circuitry adapted to measure a parameter related to supply current consumed by the device electronics while the field device is on line;
   a memory structure adapted to receive and store data related to a plurality of successively measured supply current parameters; and
   a prediction engine coupled to the memory structure to calculate a life estimate for the device electronics based upon the plurality of supply current parameters.

2. The field device of claim 1 wherein the field device is a process control transmitter.

3. The field device of claim 1 wherein the field device is a valve.

4. The field device of claim 1 wherein the prediction engine applies a linear curve-fit to the plurality of stored supply current parameter.

5. The field device of claim 1 wherein the prediction engine applies a non-linear curve-fit to the plurality of stored supply current parameter.

6. The field device of claim 1 wherein the memory structure is an array.

7. The field device of claim 1 wherein the memory structure comprises a plurality of arrays, the first array storing data related to a plurality of successively measured supply currents, and the second array containing data related to measurement time of the first array.

8. The field device of claim 1, wherein the prediction engine is adapted to use neural network analysis for calculation of the life estimate.

9. The field device of claim 1, wherein the prediction engine is adapted to use fuzzy logic for calculation of the life estimate.

10. A method of predicting board electronics lifetime in a field device, the method comprising:
    successively measuring a plurality of parameters related to electronics supply current while the field device is on line;
    applying a mathematical model to the successively measured supply current parameters; and
    calculating a future time when the supply current is anticipated to reach a selected threshold.

11. The method of claim 10 wherein calculating the future time includes employing neural network analysis.

12. The method of claim 10 wherein calculating the future time includes employing fuzzy logic.

13. A field device coupleable to a two-wire 4–20 mA process control loop, the field device comprising:
    device electronics;
    supply current measurement circuitry coupleable to the 4–20 mA process control loop; and
    means for predicting a residual life estimate of the device electronics based upon a plurality of successive supply current measurements while the field device is on line.

* * * * *